United States Patent
Liu et al.

(10) Patent No.: US 9,957,469 B2
(45) Date of Patent: May 1, 2018

(54) COPPER CORROSION INHIBITION SYSTEM

(71) Applicant: VERSUM MATERIALS US, LLC, Tempe, AZ (US)

(72) Inventors: Wen Dar Liu, Chupei (TW); Seiji Inaoka, Macungie, PA (US); Yi-Chia Lee, Chupei (TW); Agnes Derecskei-Kovacs, Macungie, PA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days. days.

(21) Appl. No.: 14/790,966

(22) Filed: Jul. 2, 2015

(65) Prior Publication Data

US 2016/0010035 A1    Jan. 14, 2016

Related U.S. Application Data

(60) Provisional application No. 62/024,046, filed on Jul. 14, 2014.

(51) Int. Cl.
| | | |
|---|---|---|
| *C11D 3/30* | (2006.01) | |
| *C11D 3/04* | (2006.01) | |
| *C11D 3/20* | (2006.01) | |
| *C11D 3/00* | (2006.01) | |
| *C11D 3/37* | (2006.01) | |
| *C23F 11/14* | (2006.01) | |
| *C23F 11/12* | (2006.01) | |
| *H01L 21/02* | (2006.01) | |
| *H01L 21/67* | (2006.01) | |
| *C11D 3/33* | (2006.01) | |
| *C11D 7/26* | (2006.01) | |
| *C11D 7/32* | (2006.01) | |
| *C11D 11/00* | (2006.01) | |

(52) U.S. Cl.
CPC .............. *C11D 3/30* (2013.01); *C11D 3/0073* (2013.01); *C11D 3/042* (2013.01); *C11D 3/2082* (2013.01); *C11D 3/2086* (2013.01); *C11D 3/33* (2013.01); *C11D 3/3723* (2013.01); *C11D 3/3757* (2013.01); *C11D 3/3765* (2013.01); *C11D 7/265* (2013.01); *C11D 7/3209* (2013.01); *C11D 7/3245* (2013.01); *C11D 11/0047* (2013.01); *C23F 11/124* (2013.01); *C23F 11/141* (2013.01); *H01L 21/02068* (2013.01); *H01L 21/6704* (2013.01)

(58) Field of Classification Search
CPC ................................. C11D 3/30; C11D 3/0073
USPC ........................................................ 510/175
See application file for complete search history.

(56) References Cited

U.S. PATENT DOCUMENTS

| | | |
|---|---|---|
| 4,970,015 A | 11/1990 | Garcia |
| 5,415,813 A | 5/1995 | Misselyn et al. |
| 6,063,286 A | 5/2000 | Steuerle et al. |
| 6,147,002 A | 11/2000 | Kneer |
| 6,218,087 B1 | 4/2001 | Tanabe et al. |
| 6,224,785 B1 * | 5/2001 | Wojtczak ............... C09K 13/00 252/79.1 |
| 6,268,323 B1 | 7/2001 | Honda et al. |
| 6,372,050 B2 | 4/2002 | Honda et al. |
| 6,663,306 B2 | 12/2003 | Policicchio et al. |
| 6,669,391 B2 | 12/2003 | Policicchio et al. |
| 6,673,757 B1 | 1/2004 | Kneer et al. |
| 6,726,386 B1 | 4/2004 | Gruenbacher et al. |
| 6,814,519 B2 | 11/2004 | Policchio et al. |
| 6,854,911 B2 | 2/2005 | Policicchio et al. |
| 6,910,823 B2 | 6/2005 | Policicchio et al. |
| 6,916,772 B2 | 7/2005 | Zhou et al. |
| 6,948,873 B2 | 9/2005 | Policicchio et al. |
| 7,144,173 B2 | 12/2006 | Policicchio et al. |
| 7,182,537 B2 | 2/2007 | Policicchio et al. |
| 7,250,391 B2 | 7/2007 | Kanno et al. |
| 7,273,813 B2 | 9/2007 | Emami et al. |
| 7,390,423 B2 | 6/2008 | Benning |
| 7,416,680 B2 | 8/2008 | Benning |
| 7,442,213 B2 | 10/2008 | Ortiz et al. |
| 7,524,808 B2 | 4/2009 | Futterer et al. |
| 7,825,079 B2 | 11/2010 | Suzuki et al. |
| 7,998,914 B2 | 8/2011 | Shimada et al. |
| 8,148,310 B2 | 4/2012 | Lee |
| 8,148,311 B2 | 4/2012 | Lee |
| 8,277,394 B2 | 7/2012 | Zhu et al. |
| 8,293,699 B2 | 10/2012 | Futterer et al. |
| 8,431,516 B2 | 4/2013 | Lee |
| 2001/0034313 A1 | 10/2001 | Honda et al. |
| 2001/0050350 A1 * | 12/2001 | Wojtczak ............... C09K 13/00 252/175 |
| 2002/0013238 A1 | 1/2002 | Wojtczak et al. |
| 2002/0077259 A1 * | 6/2002 | Skee ..................... C11D 3/0073 510/175 |
| 2002/0166573 A1 | 11/2002 | Policicchio et al. |
| 2002/0168216 A1 | 11/2002 | Policicchio et al. |
| 2003/0034050 A1 | 2/2003 | Policicchio et al. |
| 2003/0073385 A1 | 4/2003 | Benning et al. |
| 2003/0095826 A1 | 5/2003 | Policicchio et al. |
| 2003/0119692 A1 * | 6/2003 | So ............................ C11D 3/30 510/256 |

(Continued)

FOREIGN PATENT DOCUMENTS

| | | |
|---|---|---|
| EP | 2922086 A1 | 9/2015 |
| JP | 2014101476 A2 | 6/2014 |

*Primary Examiner* — Nicole M Buie-Hatcher
*Assistant Examiner* — M. Reza Asdjodi
(74) *Attorney, Agent, or Firm* — Lina Yang

(57) ABSTRACT

There are provided metal corrosion inhibition cleaning compositions, methods and system for copper (Cu), tungsten (W), titanium (Ti), tantalum (Ta), cobalt (Co), and aluminum (Al). The metal corrosion inhibition cleaning compositions provide corrosion inhibition effects by use a combination of two chemicals—at least one multi-functional amine that has more than one amino groups; and at least one multi-functional acid that has more than one carboxylate groups. The metal corrosion inhibition cleaning compositions are effective for cleaning the residues deriving from high density plasma etching followed by ashing with oxygen containing plasmas; and slurry particles and residues remaining after chemical mechanical polishing (CMP).

18 Claims, No Drawings

(56) References Cited

U.S. PATENT DOCUMENTS

| | | |
|---|---|---|
| 2003/0126709 A1 | 7/2003 | Policicchio et al. |
| 2003/0126710 A1 | 7/2003 | Policicchio et al. |
| 2003/0127108 A1 | 7/2003 | Policicchio et al. |
| 2003/0129846 A1* | 7/2003 | Liu ............... H01L 21/02074 438/698 |
| 2003/0130149 A1 | 7/2003 | Zhou et al. |
| 2003/0133740 A1 | 7/2003 | Policicchio et al. |
| 2003/0199406 A1 | 10/2003 | Anzures et al. |
| 2004/0081922 A1 | 4/2004 | Ikemoto et al. |
| 2004/0086320 A1 | 5/2004 | Policicchio et al. |
| 2004/0106531 A1 | 6/2004 | Kanno et al. |
| 2004/0224866 A1* | 11/2004 | Matsunaga ............ C11D 3/0073 510/175 |
| 2004/0226123 A1 | 11/2004 | Policicchio et al. |
| 2005/0009714 A1* | 1/2005 | Chen ............... H01L 21/3212 508/591 |
| 2005/0089489 A1 | 4/2005 | Carter |
| 2005/0098758 A1 | 5/2005 | Benning et al. |
| 2005/0112892 A1* | 5/2005 | Chen ................... C09G 1/02 438/692 |
| 2005/0127318 A1 | 6/2005 | Benning et al. |
| 2005/0215459 A1 | 9/2005 | Policicchio et al. |
| 2005/0252525 A1* | 11/2005 | Cheng ................ B08B 3/08 134/2 |
| 2005/0287480 A1 | 12/2005 | Takashima et al. |
| 2006/0174912 A1 | 8/2006 | Emami et al. |
| 2008/0045016 A1 | 2/2008 | Andou et al. |
| 2008/0220446 A1 | 9/2008 | Gerard et al. |
| 2008/0312118 A1 | 12/2008 | Futterer et al. |
| 2009/0036343 A1* | 2/2009 | Chen ................. C11D 7/3209 510/175 |
| 2009/0065735 A1 | 3/2009 | Kolics et al. |
| 2009/0124525 A1 | 5/2009 | Futterer et al. |
| 2009/0130849 A1 | 5/2009 | Lee |
| 2009/0137191 A1 | 5/2009 | Lee |
| 2009/0281017 A1 | 11/2009 | Suzuki et al. |
| 2009/0291873 A1 | 11/2009 | Tamboli |
| 2010/0120647 A1 | 5/2010 | Zhu et al. |
| 2010/0152085 A1 | 6/2010 | Shimada et al. |
| 2010/0203735 A1 | 8/2010 | Nakamura et al. |
| 2010/0234263 A1 | 9/2010 | Wasan et al. |
| 2011/0027995 A1 | 2/2011 | Ishibashi |
| 2011/0098205 A1 | 4/2011 | Lee |
| 2011/0152157 A1 | 6/2011 | Woo et al. |
| 2011/0160112 A1 | 6/2011 | Chang et al. |
| 2011/0247650 A1 | 10/2011 | Lee |
| 2011/0281436 A1 | 11/2011 | Inaba et al. |
| 2012/0080053 A1 | 4/2012 | Hidaka et al. |
| 2012/0129345 A1 | 5/2012 | Lee |
| 2012/0172227 A1* | 7/2012 | Tachiya ................ A01N 37/44 504/320 |
| 2012/0172272 A1 | 7/2012 | Park et al. |
| 2012/0172274 A1 | 7/2012 | Mizuta et al. |
| 2012/0279522 A1 | 11/2012 | Varrin, Jr. et al. |
| 2012/0285484 A1* | 11/2012 | Liu ..................... B08B 1/00 134/6 |
| 2013/0247941 A1 | 9/2013 | Woo et al. |
| 2014/0109931 A1* | 4/2014 | Lee ..................... C11D 7/10 134/3 |
| 2016/0010035 A1* | 1/2016 | Liu ..................... C11D 3/30 510/175 |

\* cited by examiner

COPPER CORROSION INHIBITION SYSTEM

CROSS-REFERENCE TO RELATED APPLICATIONS

This patent application is a non-provisional of U.S. provisional patent application Ser. No. 62/024,046, filed on Jul. 14, 2014, which is incorporated herein by reference in its entirety.

BACKGROUND OF THE INVENTION

The present invention relates to metal-corrosion inhibitors, metal-corrosion inhibition cleaning compositions, and metal-corrosion inhibition cleaning systems and methods of using the metal-corrosion inhibitors. The present invention relates to the applications applied to semiconductor devices containing delicate metal such as copper (Cu), tungsten (W), titanium (Ti), tantalum (Ta), cobalt (Co), and aluminum (Al), specifically copper interconnecting structures.

As microelectronic fabrication integration levels have increased and patterned microelectronic device dimensions have decreased, it has become increasingly common in the art to employ copper metallizations, low-k and high-k dielectrics.

In the manufacturing process, a thin film of photoresist is deposited on a wafer substrate, and then circuit design is imaged on the thin film. Following baking, the unpolymerized resist is removed with a photoresist developer. The resulting image is then transferred to the underlying material, which is generally a dielectric or metal; by way of reactive plasma etch gases or chemical etchant solutions. The etchant gases or chemical etchant solutions selectively attack the photoresist-unprotected area of the substrate. As a result of the plasma etching process, photoresist, etching gas and etched material by-products are deposited as residues around or on the side wall of the etched openings on the wafer or substrate.

Removal of these etches and/or ash residues following the plasma etch and/or ashing process has proved problematic. Failure to completely remove or neutralize these residues can result in the absorption of moisture and the formation of undesirable materials that can cause corrosion to the metal structures. The circuitry materials are corroded by the undesirable materials and produce discontinuances in the circuitry wiring and undesirable increases in electrical resistance.

Furthermore, in the metal wiring formation utilizing chemical mechanical polishing (CMP), both the surface and the back of a wafer are markedly contaminated with the polishing agent remaining after the metal polishing, a polishing scrap produced by the polishing and metal impurities contained in the polishing agent and the polishing pad, and therefore it is inevitable to clean the surface thereof after the polishing.

In general, in order to remove particles present on a wafer surface, it is desired to carrying out a cleaning with an alkaline solution, because it is important to inhibit re-adhesion of particles once removed out of the surface thereof.

While, in order to remove metal impurities effectively, it is desired to carry out the cleaning with an acid solution having a strong metal dissolution power. However, as is known, a metal is subject to corrosion with these alkaline and acid solutions. Therefore, in the case where the wafer surface on which the metal wiring lays bare is cleaned with these solutions, there is usually a problem that the metal surface after the cleaning is subjected to corrosion, thereby causing increase of a wiring resistance and moreover a breaking down of the wiring.

An attempt to use corrosion inhibitors to avoid the metal-corrosion has been made.

The various prior art compositions have drawbacks that include unwanted removal of metal or insulator layers and the corrosion of desirable metal layers, particularly copper or copper alloys features. Some prior art formulations employ corrosion inhibiting additives to prevent undesirable copper metal corrosion during the cleaning process. However, those conventional corrosion-inhibiting additives typically have detrimental effects on the cleaning process because those additives can interact with the residue and inhibit dissolution of such residue into the cleaning fluid.

For example, the passivator chemistries, such as aromatic hydrocarbon compounds, for example, benzotriazole and 5-methylbenzimidazole, do not easily rinse off the copper surface after completion of the cleaning process. Such additives therefore remain on the surface sought to be cleaned, and result in contamination of the integrated circuits. Contamination of the integrated circuit can adversely increase the electrical resistance of contaminated areas and cause unpredictable conducting failure within the circuit.

Other antioxidant (sacrificial) chemistries, such as catechol etc., have known to have bath life issues.

More work has been done and summarized as follows.

U.S. Pat. No. 6,755,989 describes a semiconductor wafer cleaning formulation, including 1-21 wt % fluoride source, 20-55 wt % organic amine(s), 0.5-40 wt % nitrogenous component, e. g., a nitrogen-containing carboxylic acid or an imine, 23-50 wt % water, and 0-21 wt % metal chelating agent(s). The formulations are useful to remove residue from wafers following a resist plasma ashing step, such as inorganic residue from semiconductor wafers containing delicate copper interconnecting structures.

U.S. Pat. No. 6,224,785 describes a aqueous ammonium fluoride and amine containing compositions for cleaning inorganic residues on semiconductor substrates. The semiconductor wafer cleaning formulation for use in post plasma ashing semiconductor fabrication comprising the following components in the percentage by weight ranges shown: Ammonium fluoride and/or a derivative thereof; 1-21 wt %; an organic amine or mixture of two amines; 20-55 wt % water; 23-50 wt % a metal chelating agent or mixture of chelating agents. 0-21 wt %

U.S. Pat. No. 7,521,406 describes a microelectronic cleaning compositions for cleaning microelectronic substrates, and particularly cleaning compositions useful with and having improved compatibility with microelectronic substrates characterized by silicon dioxide, sensitive low-K or high-K dielectrics and copper, tungsten, tantalum, nickel, gold, cobalt, palladium, platinum, chromium, ruthenium, rhodium, iridium, hafnium, titanium, molybdenum, tin and other metallization, as well as substrates of Al or Al(Cu) metallizations and advanced interconnect technologies, are provided by microelectronic cleaning compositions comprising halogen acids, salts and derivatives thereof.

It is therefore one object of the present invention to provide corrosion inhibitors for protection of copper structures on the semiconductor wafer or substrate.

It is another object of the invention to provide corrosion inhibitors that are easily rinsed off the substrate by water or other rinse medium after the completion of the residue-removal process, thereby reducing contamination of the integrated circuit.

It is another object of the present invention to provide chemical formulations (or compositions) and systems that effectively remove residue following a resist ashing step, and/or a CMP step, without attacking and/or potentially degrading delicate metal structures intended to remain on the wafer.

It is another object of the present invention to provide methods of using the corrosion inhibitors, the chemical compositions and systems that effectively remove residue following a resist ashing step, and/or a CMP step.

BRIEF SUMMARY OF THE INVENTION

The needs are satisfied by using the disclosed metal corrosion inhibition compositions, methods, and systems.

In one aspect, a metal corrosion inhibition cleaning composition is provided. The composition comprises:
1) 0.1 wt % to 5 wt % of at least one multi-functional acid;
2) 0.0 to 30 wt % of at least one multi-functional amine; and
3) remaining is substantially liquid carrier;
wherein
the multi-functional amine is an amine or a polyamine that has more than one amino group in one molecule;
the multi-functional acid is an acid or a multi-acid that has more than one carboxylate groups in one molecule; and
the liquid carrier is selected from the group consisting of organic solvent, water, and combinations thereof.

In another aspect, a method of effectively removing residues from a semiconductor wafer containing at least one metal is provided. The process comprises steps of:
a) providing a semiconductor wafer having at least a surface containing at least one metal and residues;
b) providing a metal corrosion inhibition cleaning composition comprising:
(i) 0.1 wt % to 5 wt % of at least one multi-functional acid;
(ii) 0.0 to 30 wt % of at least one multi-functional amine; and
(iii) remaining is substantially liquid carrier;
wherein
the multi-functional amine is an amine or a polyamine that has more than one amino group in one molecule;
the multi-functional acid is an acid or a multi-acid that has more than one carboxylate groups in one molecule; and
the liquid carrier is selected from the group consisting of organic solvent, water, and combinations thereof;
c) contacting the semiconductor wafer with the metal corrosion inhibition cleaning composition; and
d) cleaning the residues;
wherein at least a portion of the surface having the residues is in contact with the metal corrosion inhibition cleaning composition.

In yet another aspect, a semiconductor wafer cleaning system is provided. The system comprises:
a semiconductor wafer having at least a surface containing at least one metal and residues; and
a metal corrosion inhibition cleaning composition comprising:
(i) 0.1 wt % to 5 wt % of at least one multi-functional acid;
(ii) 0.0 to 30 wt % of at least one multi-functional amine; and
(iii) remaining is substantially liquid carrier;
wherein
the multi-functional amine is an amine or a polyamine that has more than one amino group in one molecule;
the multi-functional acid is an acid or a multi-acid that has more than one carboxylate groups in one molecule; and
the liquid carrier is selected from the group consisting of organic solvent, water, and combinations thereof;
wherein at least a portion of the surface having the residues is in contact with the metal corrosion inhibition cleaning composition.

The multi-functional amine includes, but is not limited to polyethylenimine, triamine, pentamine, hexamine, and combinations thereof.

The multi-functional acid includes, but is not limited to dicarboxylic acid (such as malonic acid, malic acid et al), dicarboxylic acid with aromatic moieties (such as phthalic acid et al), and combinations thereof; tricarboxylic acid (such as citric acid et al), tricarboxylic acid with aromatic moieties (such as trimellitic acid, et al), and combinations thereof; tetracarboxylic acid (such as ethylenediaminetetraacetic acid (EDTA) et al); tetracarboxylic acid with aromatic moieties (such as pyromellitic acid) and combinations thereof.

The organic solvent ranges up to 70 wt %; and includes, but is not limited to propylene glycol (PG), glycol ethers, aprotic solvents such as N-methylpyrrolidone (NMP), dimethyl sulfoxide (DMSO), dimethylacetarnide (DMAC), sulfolane, dimethylformamide (DMF) and combinations thereof.

The metal corrosion inhibition cleaning composition can further comprise fluoride source, base, and optionally metal chelating agent, surfactant, stabilizer, corrosion inhibitor, and buffering agent.

The fluoride source ranges from 0.01 wt % to 1.0 wt %; and includes, but is not limited to hydrofluoric acid (HF), ammonium fluoride ($NH_4F$), ammonium bifluoride ($NH_4HF_2$), tetramethylammonium fluoride (TMAF), and combinations thereof.

The base ranges up to 50 wt %; and includes, but is not limited to triethanolamine (TEA) and substituted derivatives, diethanolamine and substituted derivatives, monoethanolamine and substituted derivatives, and combinations thereof.

The metal corrosion inhibition cleaning composition has a pH ranging from 5 to 10.

Other aspects, features and embodiments of the invention will be more fully apparent from the ensuing disclosure and appended claims.

DETAILED DESCRIPTION OF THE INVENTION

The present invention provides new metal corrosion inhibitors for copper (Cu), tungsten (W), titanium (Ti), tantalum (Ta), cobalt (Co), and aluminum (Al). The present invention further provides the new metal corrosion inhibitors containing cleaning compositions or compositions (they are used exchangeably) suitable for cleaning semiconductor substrates/wafers with surfaces containing delicate metal structures. The compositions are effective for clean the residues deriving from high density plasma etching followed by ashing with oxygen containing plasmas; and slurry particles and residues remaining after CMP (chemical mechanical polishing).

The present invention advantageously uses a combination of two chemicals: at least one multi-functional amine; and at least one multi-functional acid.

The multi-functional amine is an amine or a polyamine that has more than one amino group. The multi-functional acid is an acid or a multi-acid that has more than one carboxylate groups.

Without desiring to be bound by theory, it is believed that the multi-functional amine (with multiple amino groups in one molecule) and multi-functional acid (with more than one carboxylate groups in one molecule) form a complex that stays being complexed. The complex provides functional groups that are specifically attracted to free metal atoms and thus attached to the metal surfaces through carboxylate moieties (the carboxylate groups are bridging between amines and metal such as Cu surface) to form protective layers to prevent the metal surfaces being corroded by cleaning compositions during the cleaning process. Thus, passivation of metal such as surface is through the inhibition of metal oxide formation, caused by blocking contact of metal with atmospheric oxygen.

Moreover, the new metal corrosion inhibition compositions can be easily rinsed off by deionized water or other solutions and therefore leaves very little contamination on the copper surface after the cleaning operation.

One of the benefits from the compositions is a long bath life as this polyamine-polyacid complex is not considered as an antioxidant. This complex still employs the use of passivating agent to protect Cu from corrosion: its adsorption energy is much lower than that of widely adopted Cu corrosion inhibitor, like benzotriazole or other thiazole derivatives.

More specifically, the metal corrosion inhibition cleaning compositions contain (i) at least one amine or polyamine that has more than one amino groups; (ii) at least one acid or multi-acid that has more than one carboxylate groups; and (iii) remaining is substantially liquid carrier which includes, but is not limited to organic solvent, water, and combinations thereof.

The metal corrosion inhibition cleaning compositions can further contain (iv) fluoride source, and (v) base.

Optionally, the compositions may contain one or more of metal chelating agents, surfactant, stabilizer, corrosion inhibitor, and buffering agent.

The multi-functional amine (the amine or polyamine that has more than one amino group) includes, but is not limited to, polyethylenimine, triamine, pentamine, and hexamine.

The compositions suitably contain from 0.0 wt % to 30 wt % of the multi-functional amine; preferably from 0.1 wt % to 25 wt %, and more preferably from 0.5 wt % to 20 wt % amine or polyamine that has more than one amino groups.

The multi-functional acid is an acid or a multi-acid that has more than one carboxylate groups includes, but is not limited to (i) dicarboxylate acid (such as malonic acid, malic acid, et al); dicarboxylic acid with aromatic moieties (such as phthalic acid et al), and combinations thereof; (ii) tricarboxylic acid (such as citric acid et al), tricarboxylic acid with aromatic moieties (such as trimellitic acid, et al), and combinations thereof; and (iii) tetracarboxylic acid (such as ethylenediaminetetraacetic acid (EDTA) et al); tetracarboxylic acid with aromatic moieties (such as pyromellitic acid) and combinations thereof.

The compositions suitably contain from 0.1 wt % to 5 wt % of multi-functional acid; preferably from 0.25 wt % to 3 wt %, and more preferably from 0.5 wt % to 2.0 wt % acid or multi-acid that has more than one carboxylate groups.

The fluoride source includes, but is not limited to hydrofluoric acid (HF), ammonium fluoride ($NH_4F$), ammonium bifluoride ($NH_4HF_2$), tetramethylammonium fluoride (TMAF).

The compositions suitably contain from 0.01 wt % to 1.0 wt % fluoride source, preferably from 0.1 wt % to 1.0 wt %, and more preferably from 0.5 wt % to 1.0 wt % fluoride source.

The organic solvent includes, but is not limited to propylene glycol (PG), glycol ethers, aprotic solvents such as N-methylpyrrolidone (NMP), dimethyl sulfoxide (DMSO), dimethylacetamide (DMAC), sulfolane and dimethylformamide (DMF).

The compositions suitably contain up to 70 wt % organic solvent; preferably up to 60 wt %, and more preferably up to 50 wt % organic solvent.

The compositions suitably contain up to 30 wt % water, preferably up to 25 wt %, and more preferably up to 22 wt % water.

The compositions suitably contain other amines as a base to effectively remove residues. The amines can include, but are not limited to triethanolamine (TEA), diethanolamine, monoethanolamine and their substituted derivatives.

The compositions suitably contain up to 50 wt % base; preferably up to 40 wt %, and more preferably up to 30 wt % base.

The compositions may contain one or more metal chelating agents, surfactants, stabilizers, corrosion inhibitors, buffering agents, and co-solvents, as useful or desired in a given end use application of compositions of the invention.

Additionally, compositions of the present invention have a pH ranging from 5 to 10; preferably 6 to 9, and more preferably 7.5 to 8.5.

WORKING EXAMPLES

The features and advantages of the invention are more fully shown by the following non-limiting examples. In the examples presented below, all percentages were weight percentages unless otherwise indicated. pH for the compositions was around 7.5 to 8.5.

Example 1

Working composition 45 comprised 49.34 wt % PG, 4.13 wt % citric acid (29% concentration in water), 28.55 wt % TEA, 16.98 wt % HF (5% concentration in water), and 1.00 wt % polyethylenimine (mw=800).

The chemical constituents for comparative compositions 45A, 45D, and 45G were shown in Table I.

Composition 45A was prepared by replacing citric acid (having three carboxylate groups) with acetic acid (having one carboxylate group). Thus, Composition 45A did not have a multi-functional acid.

Composition 45C was prepared by replacing polyethylenimine (mw=800) (a multi-functional amine) with monoethanolamine (MEA) (non-multi-functional amine). Thus, Composition 45C did not have a multi-functional amine. In addition, citric acid was replaced by polyacrylic acid (aliphatic polybasic acid) (35% concentration in water).

Composition 45D was prepared by replacing part (23.95 wt %) of PG with DIW. Thus, Composition 45D was a more aqueous composition of 45.

Please note that the additional small amount of DIW in 45A, 45C and 45G should not affect the performance of Cu ER, since there were water in the compositions from, for example, citric acid (29% concentration in water), HF (5% concentration in water), and polyacrylic acid (35% concentration in water).

TABLE I

|  | 45 | 45A | 45C | 45D | 45G | 47N |
|---|---|---|---|---|---|---|
| Water |  | 3.01 |  | 23.94 | 0.49 | 23.72 |
| Propylene glycol | 49.34 | 49.34 | 49.34 | 25.40 | 49.85 | 25.40 |
| Citric acid (29%) | 4.13 |  |  | 4.13 | 4.13 | 5.35 |
| Acetic acid |  | 1.12 |  |  |  |  |
| Triethanolamine | 28.55 | 28.55 | 28.55 | 28.55 | 28.55 | 28.55 |
| HF (5%) | 16.98 | 16.98 | 16.98 | 16.98 | 16.98 | 16.98 |
| Polyacrylic acid (35%) |  |  | 3.85 |  |  |  |
| Polyethylenimine (Mw = 800) | 1.00 | 1.00 |  | 1.00 |  |  |
| Monoethanolamine |  |  | 1.39 |  |  |  |
| Cu etch rate (Å/min: 0-5 min) | 2.09 | 6.74 | 8.32 | 6.03 | 7.58 | 10.8 |
| Cu etch rate (Å/min: 15-30 min) | 0.80 | 8.84 | 10.07 | 4.11 | 7.55 | 8.10 |
| Cu etch rate (Å/min: 15-60 min) | 0.48 | 10.87 | 9.34 | 3.70 | 7.70 | 7.20 |

Composition 45G was prepared without using polyethylenimine (mw=800). Thus, Composition 45G did not have a multi-functional amine.

Composition 47N was a more aqueous composition of 45G. The composition had no multi-functional amine and part of PG was replaced by DIW.

This set of compositions was tested on blank copper substrates. The etch rate (ER) for copper measured at 0-5, 15-30, and 15-60 minutes were shown in Table I.

Working composition 45 provided the best corrosion inhibition for Cu. The Cu etch rate was less than 2.09 Å/min.

Comparative compositions without the novel corrosion inhibition system gave the following etch rates:

45A having no multi-functional acid gave Cu ER of 6.74~10.87 Å/min;
45C having no multi-functional amine gave Cu ER of 8.32~10.07 Å/min; and
45G having no multi-functional amine, 7.55~7.70 Å/min; and more aqueous 47N having no multi-functional amine, 7.20~10.80 Å/min.

45D having multi-functional amine and multi-functional acid; but with additional DI water raised Cu etch rate a little but still gave a low etch rate of 3.7 Å/min.

This set of working examples has shown that the compositions containing corrosion inhibitors of the combination of multi-functional amine that has more than one amino groups, and multi-functional acid that has more than one carboxylate groups (for example, 3 carboxylate groups) gave the unexpected and unique synergetic corrosion inhibition effects.

Example 2

This set of experiments was carried out to test compositions comprising citric acid and another multi-functional acid with aromatic moieties. The multi-functional acids with aromatic moieties were trimellitic acid, pyromellitic acid and phthalic acid.

Composition 53J comprised 46.67 wt % PG, 4.83 wt % citric acid (29% concentration in water), 28.00 wt % TEA, 20.00 wt % HF (5% concentration in water), and 1.00 wt % polyethylenimine (mw=800).

Composition 53G was prepared by replacing a small part of citric acid in Composition 53J with 0.20 wt % of pyromellitic acid.

As shown in Table II, Composition 53J provided the Cu etch rate of 0.28~2.46 Å/min. Composition 53G provided the Cu etch rate of 0.49~3.19 Å/min. Thus, the addition of multi-functional acids with aromatic moieties did not affect the Cu ER.

TABLE II

|  | 53J (wt %) | 53G (wt %) |
|---|---|---|
| Propylene glycol | 46.17 | 46.67 |
| Citric acid (29%) | 4.83 | 4.13 |
| Triethanolamine | 28.00 | 28.00 |
| HF 5% | 20.00 | 20.00 |
| Pyromellitic acid |  | 0.20 |
| Polyethylenimine (Mw = 800) | 1.00 | 1.00 |
| Cu etch rate (Å/min: 0-15 min) | 2.46 | 3.19 |
| Cu etch rate (Å/min: 15-60 min) | 1.41 | 1.67 |

Example 3

A set of experiments on composition 47 series was carried out to test the use of multi-functional acids with aromatic moieties in the compositions. The multi-functional acids with aromatic moieties tested were trimellitic acid, pyromellitic acid and phthalic acid.

In addition, as shown in Table III, this set of experiments was carried out in compositions that were more aqueous. Those compositions allowed higher wt % usage of water.

A group of experiments (composition 47A to 47B) was carried out to use one multi-functional acids with aromatic moieties in the compositions.

Composition 47A was prepared with DIW, Propylene glycol (PG), Triethanolamine (TEA), HF (5% concentration in water), 2.20 wt % trimellitic acid (a multi-functional acid), and polyethylenimine (mw=800) (a multi-functional amine).

Composition 47B was prepared very similarly as composition 47A, with DIW, PG, TEA, HF (5% concentration in water), 2.70 wt % phthalic acid (a multi-functional acid), and polyethylenimine (mw=800) (a multi-functional amine).

As shown in Table III, the use of more than 2.0 wt % amount of those multi-functional acids with aromatic moieties alone (without the use of citric acid) raised Cu ER to 6.03~6.52 Å/min. and 6.75~7.27 Å/min. from compositions 47A and 47B respectively.

Replacing a multi-functional acid without aromatic moieties with a multi-functional acid with aromatic moieties did not give a good Cu ER.

TABLE III

|  | 47A (wt %) | 47B (wt %) | 47L (wt %) | 47E (wt %) | 47F (wt %) | 47M (wt %) | 47H (wt %) | 47I (wt %) | 47J (wt %) |
|---|---|---|---|---|---|---|---|---|---|
| Water | 25.87 | 25.37 | 20.92 | 21.17 | 21.17 | 26.13 | 26.17 | 25.87 | 26.57 |
| Propylene glycol | 25.40 | 25.40 | 25.40 | 25.40 | 25.40 | 25.40 | 25.40 | 25.40 | 25.40 |

TABLE III-continued

| | 47A (wt %) | 47B (wt %) | 47L (wt %) | 47E (wt %) | 47F (wt %) | 47M (wt %) | 47H (wt %) | 47I (wt %) | 47J (wt %) |
|---|---|---|---|---|---|---|---|---|---|
| Citric acid (29%) | | | 7.15 | 6.80 | 6.80 | | | | |
| Acetic acid | | | | | | 1.94 | 1.80 | | |
| Malic acid | | | | | | | | 2.10 | |
| Malonic acid | | | | | | | | | 1.40 |
| Triethanolamine | 28.55 | 28.55 | 28.55 | 28.55 | 28.55 | 28.55 | 28.55 | 28.55 | 28.55 |
| HF (5%) | 16.98 | 16.98 | 16.98 | 16.98 | 16.98 | 16.98 | 16.98 | 16.98 | 16.98 |
| Pyromellitic acid | | | | 0.10 | | | 0.10 | 0.10 | 0.10 |
| Trimellitic acid | 2.20 | | | | | | | | |
| Phthalic acid | | 2.70 | | | 0.10 | | | | |
| Polyethylenimine (MW = 800) | 1.00 | 1.00 | 1.00 | 1.00 | 1.00 | 1.00 | 1.00 | 1.00 | 1.00 |
| Cu etch rate (Å/min: 0-15 min) | 6.52 | 6.75 | 4.0 | 4.1 | 3.38 | 9.6 | 7.77 | 3.62 | 3.38 |
| Cu etch rate (Å/min: 15-60 min) | 6.03 | 7.27 | 2.6 | 2.6 | 2.78 | 7.2 | 7.68 | 3.01 | 2.79 |

Another group of experiments (compositions 47E and 47F) was carried out to use at least two multi-functional acids in the composition: the combination of citric acid with trimellitic acid, pyromellitic acid or phthalic acid.

Composition 47L prepared with one multi-functional acid, 7.15 wt % citric acid (29%) was used as the control for compositions 47E and 47F.

Composition 47E was prepared with the combination of 6.8 wt % citric acid (29%) and 0.10 wt % pyromellitic acid.

Composition 47F was prepared with the combination of 6.8 wt % citric acid (29%) and 0.10 wt % Phthalic acid.

As shown in Table III, adding multi-functional acids with aromatic moieties to the compositions, did not affect the Cu etch rates. Composition 47C gave 2.6~4.0 Å/min., compositions 47E and 47F gave 2.6 4.1~Å/min. and 2.78~3.38 Å/min. respectively. The results were in agreement with the result from Example 2 with less aqueous compositions.

Yet another group of experiments (formulations, 47H, 47I and 47J) was carried out to test compositions using different groups of acids: composition 47H was prepared using acetic acid (having one carboxylate group, i.e. non-multi-functional acid); composition 47I was prepared using malic acid (having two carboxylate groups); and composition 47J was prepared using malonic acid (having two carboxylate groups). In addition, those compositions also used pyromellitic acid (multi-functional acid with aromatic moieties). Composition 47M prepared using acetic acid alone was used as the control for composition 47H.

As shown in Table III, composition 47M with acetic acid alone had a high Cu ER (7.2~9.6 Å/min.), which was in agreement with the result (6.74~10.87 Å/min.) from the less aqueous composition 45A (shown in Table I). The addition of 0.10 wt % pyromellitic acid in composition 47H slightly reduced but still gave the high Cu ER 7.68~7.77 Å/min.

The compositions 47I and 47J having multi-functional acids malic acid and malonic acid gave lower Cu ER of 3.01~3.62 Å/min. and 2.79~3.38 Å/min. respectively.

This set of working examples had again shown that the compositions gave the best corrosion inhibition system required a combination of multi-functional amine that has more than one amino groups and multi-functional acid that has more than one carboxylate groups (for example, 2 or 3 carboxylate groups). with less aqueous compositions.

This set of working examples has shown that the compositions allowed higher wt % usage of water without altering Cu compatibility.

In conclusion, working examples 1 to 3 demonstrated that compositions having a combination of multi-functional amine that has more than one amino groups, and multi-functional acid that has more than one carboxylate groups achieved unexpected and unique synergetic corrosion inhibition effects.

Example 4

As shown in Table 4, Composition 45B was prepared with polyethylenimine (mw=800); and polyacrylic acid. However, soon after the two were mixed, sticky goo-like material was formed that was insoluble in water or organic solvents. It was strongly assumed that the gooey stuff was a complex resulting from the interaction between polyacid and polyamine. Interaction between polyamine and polyacid is known to be used to deposit a layer of films using Langmuir-Brodgett technique.

Composition 47G had a smaller amount of 0.30 wt % of polyacrylic acid solution (35% concentration in water) comparing with 45B. The composition 47G gave good Cu compatibility (Cu ER of 2.42~3.64 Å/min) but the solution suffered turbidity issue.

TABLE 4

| | 45B* (wt %) | 47G** (wt %) |
|---|---|---|
| Water | 0.28 | 20.77 |
| propylene glycol | 49.23 | 25.40 |
| Citric acid (29%) | | 7.00 |
| Polyacrylic acid (35%) | 3.85 | 0.30 |
| Triethanolamine | 28.55 | 28.55 |
| HF (5%) | 16.98 | 16.98 |
| Polyethylenimine (Mw = 800) | 1.00 | 1.00 |
| Cu etch rate (Å/min: 0-5 min) | | 6.03 |
| Cu etch rate (Å/min: 15-30 min) | | 4.11 |
| Cu etch rate (Å/min: 15-60 min) | | 3.70 |

*sticky goo-like material was formed
**turbidity issue

From the results coming out from compositions 45B and 47G, it's apparent that a right combination of a multifunctional acid and multifunctional amine is required to keep the multiacid-multiamine complex in aqueous media. To avoid the issues, it is the best that one of a multifunctional acid and a multifunctional amine is non-polymeric. The working examples have shown that these combinations with appropriate choice of molecules enabled formation of clear solutions.

The choice of multifunctional acid molecules and multifunctional amine molecules can be from either (1) polymer molecules with multiple amine functional group and a small (oligomeric) molecule with multiple acidic functional group or (2) polymer molecule with multiple acidic functional group and a small (oligomeric) molecule with multiple amine functional groups.

The working examples have shown that these combinations with appropriate choice of molecules enabled formation of clear solutions.

Example 5

This set of experiments was carried out to test compositions as shown in Table 5. 106E was prepared with monoethanolamine (MEA) and citric acid. 106G/H/C/i/J/K were prepared with diethylenetriamine (DETA) and citric acid.

TABLE 5

|  | MW* | 106E (wt %) | 106G (wt %) | 106H (wt %) | 106C (wt %) | 106i (wt %) | 106J (wt %) | 106K (wt %) |
| --- | --- | --- | --- | --- | --- | --- | --- | --- |
| DIW | 18.0153 | 4.90 | 8.29 | 8.29 | 8.30 | 6.00 | 11.50 | 18.00 |
| Citric acid (29%) | 192.124 | 10.00 | 10.50 | 10.30 | 10.00 | 10.00 | 12.00 | 15.00 |
| Diethylenetriamine | 103.17 |  | 17.77 | 18.14 | 18.70 | 21.00 | 25.00 | 30.00 |
| Monoethanolamine | 61.08 | 22.10 |  |  |  |  |  |  |
| Triethanolamine | 149.188 | 27.00 | 25.65 | 26.19 | 27.00 | 27.00 | 15.50 | 1.00 |
| HF 15% | 20.01 | 36.00 | 37.80 | 37.08 | 36.00 | 36.00 | 36.00 | 36.00 |
| Cu (0-30) e/r [A/min] |  |  | 1.13 | 2.74 | 2.63 | 0.92 | 1.66 | 1.86 | 3.15 |

MW*—molecular weight

The result demonstrated that the compositions still provided good corrosion inhibition effects.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations were not regarded as a departure from the spirit and scope of the invention, and all such variations were intended to be included within the scope of the following claims.

The invention claimed is:

1. A metal corrosion inhibition cleaning composition consisting of:
   1) 0.1 wt. % to 5 wt. % of at least one multi-functional acid;
   2) 0.1 wt. % to 25 wt. % of at least one multi-functional amine;
   3) fluoride source;
   4) up to 70 wt. % liquid carrier; and
   5) base;
   wherein
   the multi-functional amine is an amine or a polyamine that has more than one amino groups in one molecule;
   the multi-functional acid is an acid or a multi-acid that has more than one carboxylate groups in one molecule selected from the group consisting of malic acid, phthalic acid; citric acid, trimellitic acid, pyromellitic acid, and combinations thereof; and
      the liquid carrier is selected from the group consisting of organic solvent, water, and combinations thereof.

2. The metal corrosion inhibition cleaning composition of claim 1, wherein the multi-functional amine is selected from the group consisting of polyethylenimine, triamine, pentamine, hexamine, and combinations thereof.

3. The metal corrosion inhibition cleaning composition of claim 1, wherein the organic solvent is selected from the group consisting of propylene glycol (PG), glycol ethers, aprotic solvents such as N-methylpyrrolidone (NMP), dimethyl sulfoxide (DMSO), dimethylacetamide (DMAC), sulfolane, dimethylformamide (DMF) and combinations thereof.

4. The metal corrosion inhibition cleaning composition of claim 1, wherein the fluoride source is selected from the group consisting of hydrofluoric acid (HF), ammonium fluoride ($NH_4F$), ammonium bifluoride ($NH_4HF_2$), tetramethylammonium fluoride (TMAF), and combinations thereof; and the fluoride source ranges from 0.01 wt % to 5.67 wt %; the base is selected from the group consisting of triethanolamine (TEA) and substituted derivatives, diethanolamine and substituted derivatives, monoethanolamine and substituted derivatives, and combinations thereof; and the base ranges up to 50 wt. %.

5. The metal corrosion inhibition cleaning composition of claim 4, wherein the multi-functional amine is selected from the group consisting of polyethylenimine, triamine, pentamine, hexamine, and combinations thereof; and the multi-functional acid is selected from the group consisting of malic acid, citric acid; and combinations thereof.

6. The metal corrosion inhibition cleaning composition of claim 1, wherein pH of the metal corrosion inhibition cleaning composition ranges from 5 to 10; and at least one of the multi-functional acid and the multi-functional amine is non-polymeric.

7. A method of cleaning a semiconductor wafer comprising:
   a) providing the semiconductor wafer having at least a surface containing at least one metal and residues;
   b) providing a metal corrosion inhibition cleaning composition consisting of;
      1) 0.1 wt. % to 5 wt. % of at least one multi-functional acid;
      2) 0.1 wt. % to 25 wt. % of at least one multi-functional amine;
      3) up to 70 wt. % liquid carrier;
      4) fluoride source; and
      5) base;
      wherein
      the multi-functional amine is an amine or a polyamine that has more than one amino groups in one molecule;
      the multi-functional acid is an acid or a multi-acid that has more than one carboxylate groups in one molecule selected from the group consisting of malic acid, phthalic acid; citric acid, trimellitic acid, pyromellitic acid, and combinations thereof; and
      the liquid carrier is selected from the group consisting of organic solvent, water, and combinations thereof;

c) contacting the semiconductor wafer with the metal corrosion inhibition cleaning composition; and
d) cleaning the residues;
wherein at least a portion of the surface having the residues is in contact with the metal corrosion inhibition composition.

8. The method of cleaning a semiconductor wafer of claim 7, wherein the metal is selected from the group consisting of copper (Cu), tungsten (W), titanium (Ti), tantalum (Ta), cobalt (Co), and aluminum (Al) and combinations thereof; the residues are from high density plasma etching followed by ashing with oxygen containing plasmas; and from chemical mechanical polishing (CMP).

9. The method of cleaning a semiconductor wafer of claim 7, wherein the metal is copper (Cu).

10. The method of cleaning a semiconductor wafer of claim 7, wherein
the multi-functional amine is selected from the group consisting of polyethylenimine, triamine, pentamine, hexamine, and combinations thereof; and
the organic solvent is selected from the group consisting of propylene glycol (PG), glycol ethers, aprotic solvents such as N-methylpyrrolidone (NMP), dimethyl sulfoxide (DMSO), dimethylacetamide (DMAC), sulfolane, dimethylformamide (DMF) and combinations thereof.

11. The method of cleaning a semiconductor wafer of claim 7, wherein pH of the metal corrosion inhibition cleaning composition ranges from 5 to 10; and at least one of the multi-functional acid and the multi-functional amine is non-polymeric.

12. The metal corrosion inhibition cleaning composition of claim 7, wherein the fluoride source is selected from the group consisting of hydrofluoric acid (HF), ammonium fluoride ($NH_4F$), ammonium bifluoride ($NH_4HF_2$), tetramethylammonium fluoride (TMAF), and combinations thereof; and the fluoride source ranges from 0.01 wt % to 5.67 wt %; the base is selected from the group consisting of triethanolamine (TEA) and substituted derivatives, diethanolamine and substituted derivatives, monoethanolamine and substituted derivatives, and combinations thereof; and the base ranges up to 50 wt. %.

13. A semiconductor wafer cleaning system comprising:
a semiconductor wafer having at least a surface containing at least one metal and residues;
a metal corrosion inhibition cleaning composition consisting of:
1) 0.1 wt. % to 5 wt. % of at least one multi-functional acid;
2) 0.1 wt. % to 25 wt. % of at least one multi-functional amine;
3) fluoride source;
4) up to 70 wt. % liquid carrier; and
5) base;
wherein
the multi-functional amine is an amine or a polyamine that has more than one amino groups in one molecule;
the multi-functional acid is an acid or a multi-acid that has more than one carboxylate groups in one molecule selected from the group consisting of malic acid, phthalic acid; citric acid, trimellitic acid, pyromellitic acid, and combinations thereof; and
the liquid carrier is selected from the group consisting of organic solvent, water, and combinations thereof;
wherein
at least a portion of the surface having the residues is in contact with the cleaning composition.

14. The semiconductor wafer cleaning system of claim 13, wherein the metal is selected from the group consisting of copper (Cu), tungsten (W), titanium (Ti), tantalum (Ta), cobalt (Co), and aluminum (Al) and combinations thereof; the residues are from high density plasma etching followed by ashing with oxygen containing plasmas; and from chemical mechanical polishing (CMP).

15. The semiconductor wafer cleaning system of claim 13, wherein the fluoride source is selected from the group consisting of hydrofluoric acid (HF), ammonium fluoride ($NH_4F$), ammonium bifluoride ($NH_4HF_2$), tetramethylammonium fluoride (TMAF), and combinations thereof; and the fluoride source ranges from 0.01 wt % to 5.67 wt %; and the base is selected from the group consisting of triethanolamine (TEA) and substituted derivatives, diethanolamine and substituted derivatives, monoethanolamine and substituted derivatives, and combinations thereof; and the base ranges up to 50 wt %.

16. The semiconductor wafer cleaning system of claim 15, wherein the multi-functional amine is selected from the group consisting of polyethylenimine, triamine, pentamine, hexamine, and combinations thereof; the multi-functional acid is selected from the group consisting of malic acid, citric acid; and combinations thereof.

17. The semiconductor wafer cleaning system of claim 13, wherein
the multi-functional amine is selected from the group consisting of polyethylenimine, triamine, pentamine, hexamine, and combinations thereof;
and
the organic solvent is selected from the group consisting of propylene glycol (PG), glycol ethers, aprotic solvents such as NI-methylpyrrolidone (NMP), dimethyl sulfoxide (DMSO), dimethylacetamide (DMAC), sulfolane, dimethylformamide (DMF) and combinations thereof.

18. The semiconductor wafer cleaning system of claim 13, wherein pH of the metal corrosion inhibition cleaning composition ranges from 5 to 10; and at least one of the multi-functional acid and the multi-functional amine is non-polymeric.

* * * * *